United States Patent [19]

Jenik

[11] 4,097,768
[45] Jun. 27, 1978

[54] RECTIFIER

[75] Inventor: Franz Jenik, Munich, Germany

[73] Assignee: Siemens Aktiengesellschaft, Berlin & Munich, Germany

[21] Appl. No.: 747,955

[22] Filed: Dec. 6, 1976

[30] Foreign Application Priority Data

Dec. 5, 1975 Germany .............................. 2554865

[51] Int. Cl.$^2$ ............................................. H02M 7/00
[52] U.S. Cl. .................................. 307/230; 307/297; 307/310; 330/296; 328/26
[58] Field of Search .................. 328/26; 307/230, 297, 307/262, 236, 237, 261, 310; 330/22, 40

[56] References Cited

U.S. PATENT DOCUMENTS

| | | | |
|---|---|---|---|
| 3,906,386 | 9/1975 | Hongu et al. ........................... | 330/40 |
| 3,958,170 | 5/1976 | Hodgson ............................ | 328/26 X |
| 3,970,870 | 7/1976 | Horichi ............................... | 328/26 X |
| 3,970,876 | 7/1976 | Allen et al. ....................... | 307/297 X |
| 3,987,317 | 10/1976 | Hongu et al. ....................... | 330/22 X |

Primary Examiner—John S. Heyman
Attorney, Agent, or Firm—Hill, Gross, Simpson, Van Santen, Steadman, Chiara & Simpson

[57] ABSTRACT

A rectifier system for rectifying small amplitude alternating voltage signals has a first amplifier and a control amplifier. The alternating voltage signals are supplied to the first amplifier which has its operating point set between linear operation and cut-off to achieve rectifying operation. The operating point of the first amplifier is established by a control amplifier which supplies a control voltage for setting the operating point of the first amplifier. The first amplifier and control amplifier each have a transistor arranged in the same fundamental circuit and each of which are connected to the same supply voltage. The transistor in the control amplifier, however, has an amplification which is large in comparison with the amplification of the transistor in the first amplifier. The operating point of the first amplifier is stablized by the control amplifier despite fluctuations in the supply voltage or the temperature to which both amplifiers are exposed.

8 Claims, 5 Drawing Figures

RECTIFIER

BACKGROUND OF THE INVENTION

1. Field of the Invention

The invention relates to a rectifier for rectifying alternating voltage signals having a small amplitude wherein the alternating voltage signals are supplied to a first amplifier having a bent amplification characteristic and operating point at the bend-point of the amplification characteristic. The first amplifier delivers rectified signals at its output.

2. Description of the Prior Art

The use of amplifiers having a bent amplification characteristic and operating point at the bend-point of the amplification characteristic for operation as a rectifier is already generally known. Such amplifiers are frequently also characterized as class B amplifiers and are described, for example, in the Book of Meinke/Gundlach: Pocket Book of High Frequency Engineering, 1956, page 817. In a construction of an amplifier as a transistor-amplifier, the operating point of the transistor is conventionally set via a voltage divider in which the center tap is connected to the base. Since the base-emitter voltage of the transistor is subject to production tolerances and is also strongly dependent upon the temperature and the supply voltage, the adjustment of the operating point via a fixed voltage divider — particularly in the case of rectification of alternating voltage signals having a small amplitude — results in large rectification tolerances.

It is furthermore known to effect rectification of alternating voltage signals having a low amplitude with the aid of operational amplifiers and rectifier-bridge circuits. Rectifiers of this type are described, for example, in the book of Tietze/Schenk: Semiconductor Circuit Engineering, 1971, pages 244 through 250. The alternating voltage signals are supplied to the non-inverting input of the operational amplifier, whereas the inverting input is connected to a reference potential via a resistance. The output of the operational amplifier is connected to the inverting input via a rectifier-bridge circuit. Rectified alternating voltage signals result in the shunt arm of the bridge circuit. However, these rectifiers have the disadvantage that they are costly.

SUMMARY OF THE INVENTION

An object of this invention is to disclose a simple rectifier for low amplitude alternating voltage signals which exhibits small rectification tolerances.

In accordance with the invention, the object is achieved by use of a regulating amplifier which produces a direct voltage for determining the operating point of the first amplifier. The regulating amplifier has the same supply voltage as the first amplifier and contains a second amplifier constructed in the same fundamental circuit arrangement as the first amplifier, but which has an amplification which is large in comparison with the amplification of the first amplifier.

The rectifier in accordance with the invention has the advantage that it is to a large extent independent of fluctuations of the surrounding temperature and supply voltage and is also inexpensive.

A minimal dependence of the rectifier upon production tolerances is achieved if the first amplifier and the second amplifier contain transistors with equal electrical parameters.

A minimal dependence of the rectifier upon temperature fluctuations results if the first amplifier and the second amplifier contain transistors which are arranged such that they operate at the same temperature.

A particularly low dependence on fluctuations of the surrounding temperature and production tolerances is achieved if the first amplifier and the second amplifier are constructed of integrated transistors which are arranged on the same semiconductor body.

The rectifier is particularly inexpensive if the first amplifier contains a first transistor in a common emitter circuit, alternating voltate signals are supplied to the base and which delivers the rectified signals on its collector. The operating point is set via a voltage divider, a first connection of which is supplied with direct voltage, a second connection of which is connected to a voltage source, and a center tap of which is connected to the base of the first transistor.

A particularly small dependence upon fluctuations in the surrounding temperature, supply voltages, and production tolerances is achieved on account of a similar construction of the first amplifier and the second amplifier and wherein the second amplifier contains a second transistor in a common emitter circuit in which the operating point is set via a voltage divider to a first connection of which the direct voltage is supplied, to a second connection of which the supply voltage is connected, and the center tap of which is connected to the base. In addition to the second transistor in the amplifier, a third transistor is also provided whose base is connected to the collector of the second transistor, to the collector of which a reference potential is connected, and on the emitter of which the direct voltage is delivered.

In order to also be able to effect a full-wave rectification of the alternating voltage signals, it is advantageous if an additional transistor in a common emitter circuit is parallel-connected to the first transistor, if the collectors of the first transistor and the additional transistor are connected to one another, and if the alternating voltage signals are supplied as push-pull signals to the bases of the transistors.

DESCRIPTION OF THE PREFERRED EMBODIMENTS

Figure 1:
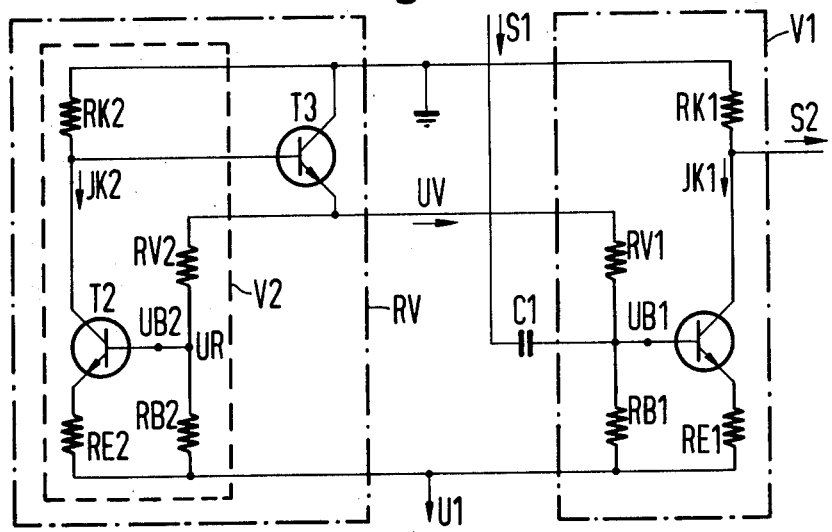
FIG. 1 illustrates a circuit diagram of a first embodiment of the rectifier of this invention.

The rectifier illustrated in FIG. 1 contains a first amplifier V1 to which alternating voltage signals S1 are supplied via a capacitor C1, and which delivers rectified signals S2 on its output. In addition, the rectifier contains a control amplifier RV which delivers to amplifier V1 a control voltage UV which sets the working point of amplifier V1. Amplifier V1 is constructed as an emitter amplifier with a negative current feedback. It contains a transistor T1 whose collector is connected via a collector resistance RK1 with a point to which a reference potential of O V, for example, is connected. The emitter of transistor T1 is connected via an emitter resistance RE 1 with a point to which a negative supply voltage U1 is connected. The operating point of amplifier V1 is set via a voltage divider consisting of two resistances RV1 and RB1 such that the amplifier functions in class B-operation and delivers signals S1 to its output as rectified signals S2.

Control amplifier RV contains a second amplifier V2 with a transistor T2 likewise connected as an emitter amplifier with an emitter resistance RE2 and collector resistance RK2 whose resistance value is much greater, for example, greater by a power of ten, than resistance RK1. Thus, the amplification of amplifier V2 is correspondingly much greater than that of amplifier V1. The collector of transistor T2 is connected to the base of an additional transistor T3 to whose collector the reference potential is connected, and to whose emitter the supply voltage U1 is connected via a voltage divider formed from two resistances RV2 and RB2. The center tap of the voltage divider is connected to the base of transistor T2. Moreover, voltage UV is delivered on the emitter of transistor T3 to amplifier V1. Further details of amplifier V1 and of control amplifier RV shall be described in the following in conjunction with FIGS. 2 and 3.

Basically, it is also possible to construct amplifiers V1 and V2 in a different fundamental circuit, for example, by means of a grounded base connection of amplifiers T1 and T2.

Figure 2:
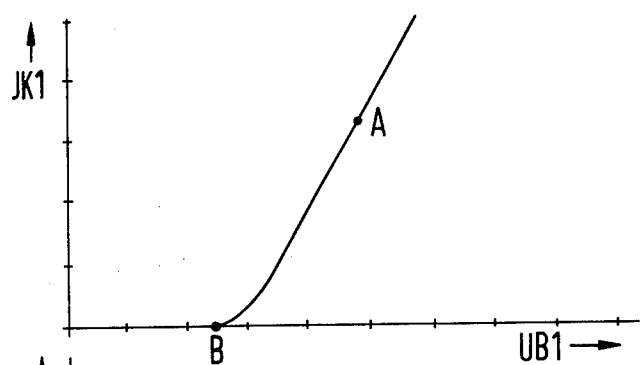
FIG. 2 is a graph illustrating an operating characteristic of a first amplifier in the rectifier of FIG. 1.

The characteristic of amplifier V1 illustrated in FIG. 2 is shown for a resistance ratio of RK1:RE1 = 10. In the X-direction, the voltage UB1 is applied to the base of transistor T1, and in the Y-direction, the current JK1 is applied through resistance RK1. At point A, amplifier V1 functions as a linear amplifier; at point B, as a rectifier. Setting of the operating point is conventionally carried out by the voltage divider consisting of resistances RV1 and RB1. Since the base-to-emitter voltage of transistor T1 is subject to production tolerances and is moreover strongly dependent upon the temperature and the supply voltage, the adjustment of point B as the operating point via a fixed voltage divider results in large rectification tolerances. In the case of a rectification of small alternating voltage signals which are smaller than IV, for example, it is therefore advantageous to carry out the operating point adjustment via a control amplifier RV which compensates the temperature influences and fluctuations in the supply voltages U1. The influence of the production tolerances can be eliminated either by utilizing integrated transistor modules or by compensation.

Figure 3:
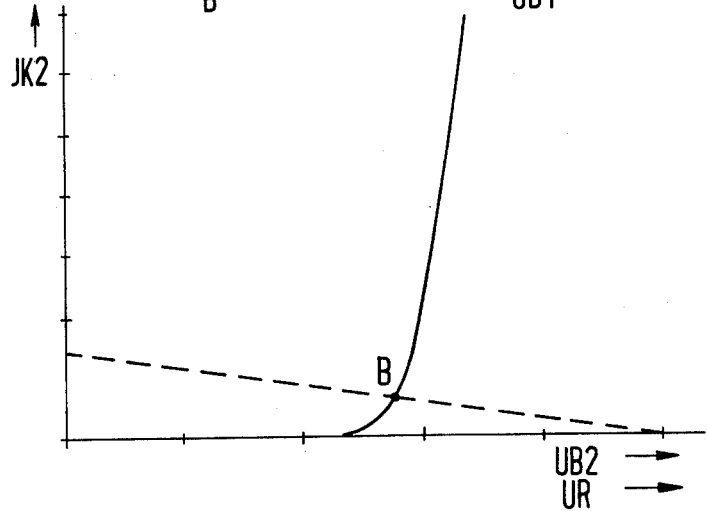
FIG. 3 illustrates characteristics of a control amplifier of the invention.

FIG. 3 illustrates the characteristics of control amplifier RV when it has been disconnected at the connection of the base of transistor T2. In the X-direction, the graph illustrates the voltage UB2 as applied to the base of transistor T2, and the voltage UR as applied on the center tap of voltage divider RV2, RB2 with respect to supply voltage U1. In the Y-direction the graph shows current JK2 through resistance RK2. The characteristic illustrated as a continuous line shows the characteristic for the collector current JK2 in dependence upon voltage UB2, and the characteristic illustrated as a broken line shows the characteristic for voltage UR in dependence upon current JK2. The intersection point of the two characteristics is operating point B. With the aid of voltage UV on the output of control amplifier RV, the operating point is stabilized for one or several amplifiers V1. Since amplifier V2 has a large amplification in comparison to amplifier V1, very small fluctuations in current JK2 are already stabilized by amplifier V2. Since amplifier V2 is constructed in the same fundamental circuit as amplifier V1, and since the adjustment of the operating point of transistor T1 in amplifier V1 proceeds by means of direct voltage UV, it is thus also guaranteed that the fluctuations in current JK1 are reduced in correspondence with amplification of amplifier V2, and that the operating point of amplifier V1 is stabilized.

In order to be able to level temperature influences, it is advantageous if control amplifier RV and amplifier V1 are arranged such that they manifest the same temperature. This can be achieved, for example, by utilizing, instead of individual transistors, an integrated transistor module in which several transistors are produced next to one another on a silicon chip, or by spacially arranging the transistors very closely together, and/or connecting them to one another in a heat-conductive fashion. These transistors have the same temperature during operation. Moreover, they have approximately the same electrical data. Due to the minimal differences in the electrical data, several amplifiers V1 can be operated by dropping resistances RV1 which have the same resistance value and an individual compensation of the individual amplifier RV1 is not necessary.

Figure 4:
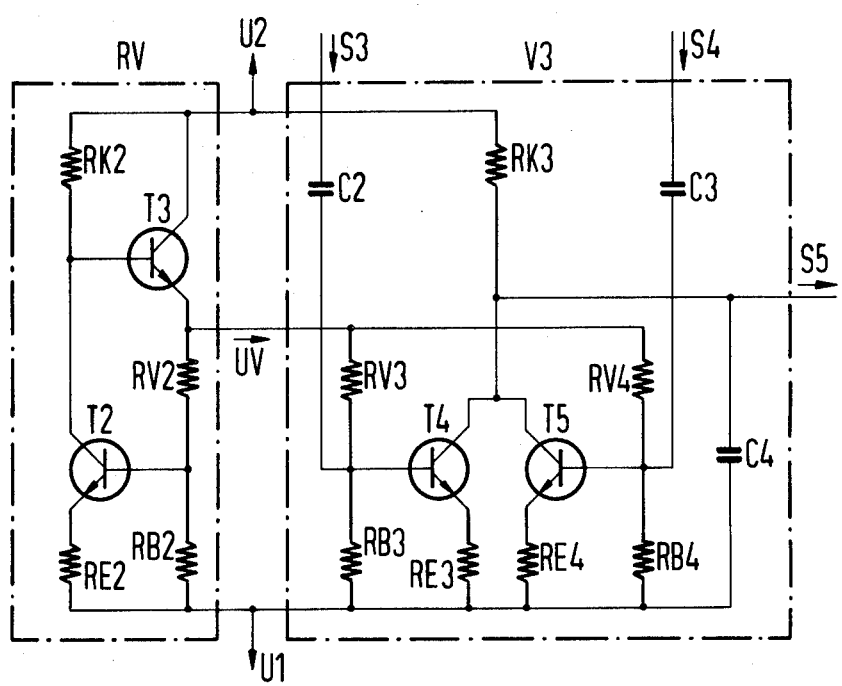
FIG. 4 illustrates a circuit diagram of a second embodiment of the rectifier of this invention.

The rectifier illustrated in FIG. 4 is provided for a fullwave rectification of alternating voltage signals which are in phase opposition. This rectifier likewise contains a control amplifier RV which is constructed similar to control amplifier RV in FIG. 1. It differs from the latter only in that the collector of transistor T3 is connected with a point to which a positive supply voltage U2 is connected. On its output, control amplifier RV delivers voltage UV to an amplifier V3. The opposite phase alternating voltage signals are supplied as signals S3 and S4 to amplifier V3, and, on its output, it delivers a rectified signal S5 whose amplitude is dependent upon the amplitude of the signals S3 and S4.

Amplifier V3 contains two transistors T4 and T5 whose collectors are connected to one another and to whose emitters the negative supply voltage U1 is connected via a resistance RE3 and RE4, respectively. Supply voltage U2 is connected to the collectors of transistors T4 and T5 via a resistance RK3. In addition, the output signal S5 is delivered there. Signal S3 is supplied to the base of transistor T4 via a capacitor C2. The adjustment of the operating point of transistor T4 proceeds in a similar manner as in the case of amplifier V1, with the aid of a voltage divider composed of two resistances RV3 and RB3. Voltage UV is connected to the voltage divider. Signal S4 is supplied to the base of transistor T5 via a capacitor C3. Here also the adjustment of the operating point proceeds via a voltage divider constructed from two resistances RV4 and RB4 to which voltage UV is likewise connected. If signal S3 assumes a positive instantaneous value, transistor T4 is conductively operated and a signal S5 results on its collector. Since signal S4 is in phase opposition with respect to signal S3, transistor T5 is simultaneously blocked. When signal S3 assumes a negative instantaneous value, transistor T4 is blocked and transistor T5 is simultaneously conductively operated. A signal S5 therefore results on the collector of transistor T5.

For the purpose of smoothing the signals S5, a capacitor C4 can be arranged between the collectors of transistors T4 and T5 and a point to which a reference potential of OV, for example, or the supply voltage U1 or U2 is connected.

Figure 5:
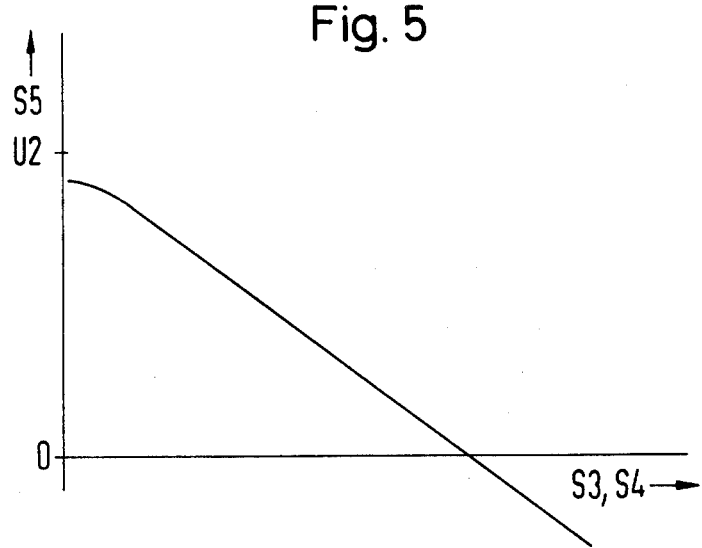
FIG. 5 illustrates a rectification characteristic of the rectifier of FIG. 4.

FIG. 5 illustrates the rectification characteristic of the rectifier illustrated in FIG. 4. The amplitude of signals S3 and S4 is illustrated in the X-direction, and the direct voltage signal S5 is illustrated in the Y-direction. With increasing amplitude of signals S3 and S4, the amplitude of direct voltage signal S5 decreases. In the case of very small signals S3 and S4, transistors T4 and T5 remain blocked and the amplitude of signal S5 is approximately equal to the positive supply voltage U2. With an increasing amplitude of signals S3 and S4, transistors T4 and T5 are increasingly conductive and the instantaneous value of signal S5 thereby decreases. In the case of very large amplitudes of signals S3 and S4, transistor T4 and T5 can be conductively operated to such an extent that the amplitude of signal S5 becomes negative and approximately equal to the negative supply voltage U1.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A rectifier for rectifying an alternating voltage signal of small amplitude in which the alternating voltage signal is supplied directly to a first amplifier having a bent amplification characteristic formed by a linear portion, cut-off portion, and bent portion connecting the linear and cut-off portions, an operating point of said first amplifier being located at the bent portion of the characteristic and which delivers rectified signals at an output, a control amplifier being connected to the first amplifier which produces a control voltage for determining said operating point of the first amplifier, a supply voltage connected to said first and control amplifiers which is the same for both, said control amplifier having a second amplifier which is constructed in a same fundamental circuit arrangement as the first amplifier but which has an amplification which is large in comparison with the amplification of the first amplifier.

2. A rectifier according to claim 1 characterized in that the first amplifier and second amplifier contain transistors having approximately the same electrical parameters.

3. A rectifier according to claim 1 characterized in that the first amplifier and second amplifier contain transistors which are arranged such that they manifest the same temperature.

4. A rectifier according to claim 1 characterized in that the first amplifier and the second amplifier are constructed as integrated transistors arranged on the same semiconductor component.

5. A rectifier according to claim 1 characterized in that the first amplifier contains a first transistor in a common emitter circuit to whose base the alternating voltage signal is supplied and on whose collector the rectifier signal is present and that the operating point of the first transistor is adjusted via a voltage divider to a first connection of which the control voltage is supplied, a second connection of which the supply voltage is supplied, and to a center tap of which the base is connected.

6. A rectifier for rectifying an alternating voltage signal of small amplitude in which the alternating voltage signal is supplied to a first amplifier having a bent amplification characteristic formed by a linear portion, cut-off portion, and bent portion connecting the linear and cut-off portions, an operating point of said first amplifier being located at the bent portion of the characteristic and which delivers rectified signals at an output, a control amplifier being connected to the first amplifier which produces a control voltage for determining said operating point of the first amplifier, a supply voltage connected to said first and control amplifiers which is the same for both, said control amplifier having a second amplifier which is constructed in a same fundamental circuit arrangement as the first amplifier but which has an amplification which is large in comparison with the amplification of the first amplifier; and wherein the first amplifier contains a first transistor in a common emitter circuit to whose base the alternating voltage signal is supplied and on whose collector the rectifier signal is present and that the operating point of the first transistor is adjusted via a voltage divider to a first connection of which the control voltage is supplied, a second connection of which the supply voltage is supplied, and to a center tap of which the base is connected; and wherein the second amplifier contains a second transistor in a common emitter circuit in which the operating point is adjusted via a voltage divider to a first connection of which the control voltage is supplied, to a second connection of which the supply voltage is supplied, and to a center tap of which the base is connected, and that the control amplifier contains a third transistor whose base is connected to the collector of the second transistor, to whose collector a reference potential is connected, and on whose emitter the control voltage is present.

7. A rectifier for rectifying an alternating voltage signal of small amplitude in which the alternating voltage signal is supplied to a first amplifier having a bent amplification characteristic formed by a linear portion, cut-off portion, and bent portion connecting the linear and cut-off portions, an operating point of said first amplifier being located at the bent portion of the characteristic and which delivers rectified signals at an output, a control amplifier being connected to the first amplifier which produces a control voltage for determining said operating point of the first amplifier, a supply voltage connected to said first and control amplifiers which is the same for both, said control amplifier having a second amplifier which is constructed in a same fundamental circuit arrangement as the first amplifier but which has an amplification which is large in comparison with the amplification of the first amplifier; and wherein the first amplifier contains a first transistor in a common emitter circuit to whose base the alternating voltage signal is supplied and on whose collector the rectifier signal is present and that the operating point of the first transistor is adjusted via a voltage divider to a first connection of which the control voltage is supplied, a second connection of which the supply voltage is supplied, and to a center tap of which the base is connected; and wherein an additional transistor is parallel-connected to the first transistor in a common emitter circuit, that the collectors of the first transistor and of the additional transistor are connected to one another, and that two alternating voltage signals are supplied, one to each of the bases of the transistors as push-pull signals.

8. A rectifier system for rectifying low amplitude signals comprising:
(a) a rectifying amplifier having an amplification characteristic curve formed by a linear portion, cutoff portion and bent portion connecting the linear and cutoff portions, said rectifying amplifier having an input connected to said low amplitude signals and an output delivering the signal is rectified form;
(b) a control amplifier means connected to said rectifying amplifier for setting an operating point of said rectifying amplifier at the characteristic curve bent portion;
(c) a common supply voltage connected to both of said rectifying and control amplifiers;
(d) means for exposing both of said control and rectifying amplifiers to the same temperatures; and
(e) said control amplifier means stabilizing the operating point of the rectifying amplifier despite fluctuations in said supply voltage and temperature.

* * * * *